(12) United States Patent
Sanders et al.

(10) Patent No.: US 7,858,425 B2
(45) Date of Patent: Dec. 28, 2010

(54) MONOLITHIC NUCLEAR EVENT DETECTOR AND METHOD OF MANUFACTURE

(76) Inventors: Thomas J. Sanders, 331 Seabreeze Dr., Indialantic, FL (US) 32901; Nicolaas W. Van Vonno, 3859 Riverside Dr., Melbourne, FL (US) 32935; Clyde Combs, 499 Cinnamon Dr., Satellite Beach, FL (US) 32937; Glenn T. Hess, 620 Grant Ct., Satellite Beach, FL (US) 32937

( * ) Notice: Subject to any disclaimer, the term of this patent is extended or adjusted under 35 U.S.C. 154(b) by 357 days.

(21) Appl. No.: 12/154,212

(22) Filed: May 21, 2008

(65) Prior Publication Data
US 2008/0290433 A1 Nov. 27, 2008

Related U.S. Application Data

(60) Provisional application No. 60/939,118, filed on May 21, 2007.

(51) Int. Cl.
*H01L 21/782* (2006.01)

(52) U.S. Cl. ............ 438/56; 438/133; 257/E21.7; 257/E27.112

(58) Field of Classification Search .......... 438/56, 438/133
See application file for complete search history.

(56) References Cited

U.S. PATENT DOCUMENTS

| | | |
|---|---|---|
| 3,281,811 A | 10/1966 | Cotterman et al. |
| 4,219,804 A | 8/1980 | Weischedel |
| 4,381,450 A | 4/1983 | Cappelli |
| 4,609,520 A | 9/1986 | Kronenberg |
| 4,687,622 A | 8/1987 | Longden |
| 4,825,081 A * | 4/1989 | Wille et al. ............ 250/551 |
| 5,010,321 A | 4/1991 | Larner et al. |
| 5,150,286 A | 9/1992 | Venditto, Jr. et al. |
| 5,391,931 A | 2/1995 | Larner |
| 5,672,918 A | 9/1997 | Kimbrough et al. |
| 5,786,975 A | 7/1998 | Duncan et al. |
| 5,811,809 A | 9/1998 | Smith et al. |

(Continued)

FOREIGN PATENT DOCUMENTS

JP     5-67729   *   3/1993

OTHER PUBLICATIONS

Thomasnet.com, Detector Provides Circumvention Against Nuclear Blast, http://news.thomasnet.com/fullstory/10792, Dec. 28, 2007, Thomas Publishing Company 2006.

(Continued)

*Primary Examiner*—A. Sefer
(74) *Attorney, Agent, or Firm*—Hayworth, Chaney & Thom.; Stephen C. Thomas; Robert A. Lynch

(57) ABSTRACT

A PIN diode-based monolithic Nuclear Event Detector and method of manufacturing same for use in detecting a desired level of gamma radiation, in which a PIN diode is integrated with signal processing circuitry, for example CMOS circuitry, in a single thin-film Silicon On Insulator (SOI) chip. The PIN diode is implemented in the p-substrate layer. The signal processing circuitry is located in a thin semiconductor layer and is in electrical communication with the PIN diode. The PIN diode may be integrated with the signal processing circuitry onto a single chip, or may be fabricated stand alone using SOI methods according to the method of the invention.

10 Claims, 11 Drawing Sheets

ISOLATED SILICON ACTIVE LAYERS

INTEGRATED PIN DIODE

U.S. PATENT DOCUMENTS

| | | | |
|---|---|---|---|
| 6,064,555 | A | 5/2000 | Czajkowski et al. |
| 2004/0028167 | A1 | 2/2004 | Singleton et al. |
| 2005/0082489 | A1 | 4/2005 | August et al. |
| 2006/0284260 | A1* | 12/2006 | Min et al. .................. 257/368 |
| 2007/0075251 | A1 | 4/2007 | Doughty et al. |
| 2009/0230516 | A1* | 9/2009 | Goodrich et al. ............ 257/653 |

OTHER PUBLICATIONS

Matra Bae Dynamics (UK)Ltd, Nuclear Event Detector, Issue 1.0 Nov. 2001, Matra BAe Dynamics, Ltd 2001.

Nu-Trek, 2005, Detectors/Overview, http://www.nu-trek.com/detectors.htm, Nu-Trek, Inc 2005.

* cited by examiner

SOI STARTING MATERIAL

SOI STARTING MATERIAL WITH A LAYER OF SILICON DIOXIDE ON ACTIVE SILICON LAYER

ISOLATED SILICON ACTIVE LAYERS

ISOLATED SILICON ACTIVE LAYERS

TOPSIDE CONTACT REGIONS READY FOR ION IMPLANTATION

THE STRUCTURE AFTER THE P+ IMPLANT

THE STRUCTURE AFTER THE N+ IMPLANT

INTEGRATED PIN DIODE

INTERDIGITATED DIODE LAYOUT

EXEMPLARY ALTERNATE DIODE LAYOUT

MONOLITHIC NUCLEAR EVENT DETECTOR AND METHOD OF MANUFACTURE

CROSS REFERENCE TO RELATED APPLICATIONS

This application claims the benefit of provisional patent application Ser. 60/939,118 filed with the USPTO on May 21, 2007, which is herein incorporated by reference in its entirety.

STATEMENT REGARDING FEDERALLY SPONSORED RESEARCH OR DEVELOPMENT

The present invention was developed under SBIR program #N00030-06-C0031, "Development of Nuclear Event Detectors and Circumvention Controller Technology".

INCORPORATION-BY-REFERENCE OF MATERIAL SUBMITTED ON A COMPACT DISK

Not applicable.

BACKGROUND OF THE INVENTION

1. Field of the Invention

The present invention relates, in general, to nuclear event detectors (NEDs), and is particularly directed to a new and improved semiconductor architectecture for such a detector, wherein a sensitive PIN diode and operate-through integrated circuitry are combined onto a single chip using a silicon-on-insulator (SOI) process that is effective to place the signal processing circuitry portion of the NED chip in CMOS circuitry located in a thin silicon layer. The use of a thin-film device minimizes generation volume and hence maximizes hardness in the transient gamma environment. The PIN diode used for sensing the transient gamma radiation is built into the structure, which maximizes generation volume, and hence maximizes detector sensitivity.

2. Background Art

Nuclear event detectors (NEDs) may be employed in a variety of systems, such as military electronic systems, whose components are susceptible to damage from transient gamma radiation. An effective nuclear event detector must first detect the transient radiation generated by the nuclear event. At a pre-determined level of transient radiation, the NED is generally employed to generate appropriate signals to either circumvent or shut down critical circuitry that might otherwise be damaged or destroyed as a result of the transient radiation.

Several types of NEDs have been developed and are thus known in the art. The most common topologies used for detecting the transient gamma radiation associated with a nuclear event utilize PIN diodes to detect the rising gamma radiation. PIN diodes are well known in the electrical arts and are often used as radiation detectors and photo detectors. A PIN diode is generally a diode with a wide, lightly doped 'near' intrinsic semiconductor region between a p-type semiconductor and an n-type semiconductor regions. Such diodes experience a detectable change in current under bias as the level of gamma radiation rises. This change in current is then characterized with respect to the desired gamma radiation threshold, and electrical circuitry is employed to measure said current and provide a desired output signal for use by the protected system. The protected system may take such action as to power down sensitive circuitry, or some other action, when a nuclear event has been detected.

A commonly used approach to transient gamma survivability uses electrical circuitry consisting of discrete and integrated components. This approach uses a PIN diode as the primary radiation detector, along with discrete packaged components, such as transistors, integrated circuit amplifiers, transistors, and resistors, to implement the circuitry necessary to perform the detection and control functions. As proper timing of the system's response to the event is critical, this approach can be quite complex, slow in response, and difficult to repeat with great certainty as to signal timing due to component tolerances, thus limiting the capabilities of the NED to accurately detect and provide the desired response to the radiation produced by a nuclear event. Furthermore, as it is also desirable to use a plurality of nuclear event detectors distributed around the system to address non-uniformities in the transient gamma radiation caused by such phenomena as airframe shadowing, the variabilities in circuit path delay and component tolerances mentioned above pose a significant risk to NED performance and repeatability.

A second approach to the nuclear event detector problem uses a hybrid or multichip module assembly. This results in a more compact solution, but the multichip assembly is complex, labor intensive to produce, and expensive. Such hybrid or multichip NEDs are generally housed within a metal or ceramic housing containing a ceramic substrate upon which the above mentioned electrical components are placed, with electrically conductive paths connecting said components contained within or upon the substrate itself. Such a hybrid may typically contain a radiation-sensing element such as a PIN diode and a signal processing and timing chip. One example of a hybrid microcircuit approach to packaging an NED is the Matra BAe Dynamics (UK) NMC6419 product, which is offered in a Dual In Line package.

A more desirable approach would be to integrate the electronics associated with the event detection and circumvention control functions on one single integrated circuit contained on a single semiconductor chip, preferably using a high-performance analog process. As used herein, the term "semiconductor chip" means the multilayer semiconductor structure prior to encapsulation or packaging. This would enable moving nuclear event detection from an exotic application such as a discrete component NED, or a complex multichip module NED, to a much simpler single chip.

However, in order to be successful, such an integrated single semiconductor chip NED must meet two conflicting requirements. The chip design must provide a circuit element that is highly sensitive to transient gamma radiation (such as the PIN diode used as a detector in the multichip module approach) while simultaneously providing analog and digital functions (the "signal processing circuitry") that are insensitive to transient gamma radiation.

With regard to said signal processing circuitry, it has been shown and is well known in the art that the use of thin-film SOI processing will provide "operate-through" capability (meaning that the circuitry continues to operate) at high transient gamma levels due to its very small generation volume. However, implementing the desired PIN diode detector in a thin SOI layer (i.e. creating a "monolithic detector") is historically problematic due to the extremely small generation volume which is inherent in the SOI process: a higher generation volume is required in order for the PIN diode to operate effectively as a detector. Thus, such a monolithic detector would not likely provide a sufficiently strong signal at the transient gamma levels of interest to function as an NED. Unfortunately, the thin film layer of silicon inherent in the SOI process is simply too thin to produce an efficient PIN diode for NED purposes.

SUMMARY OF THE INVENTION

The present invention provides an improved, simple, and cost effective NED in a monolithic device, and the method of the present invention overcomes the aforementioned obstacles in producing such a monolithic NED. In accordance with the present invention, the desire for a fully integrated, monolithic nuclear event detector, wherein the PIN diode and signal processing circuitry are contained within a monolithic semiconductor structure (i.e., "a semiconductor chip") that contains such components as operational amplifiers and comparators are integrated into a common chip is successfully achieved by the use of a commercially available SOI process. Such a process provides a thin single-crystal layer on an insulating silicon dioxide layer, both of which are fabricated on a single-crystal 'handle wafer' substrate.

In accordance with the invention, the signal processing circuitry portion of the NED semiconductor chip is implemented in CMOS circuitry located in the thin (single-crystal) silicon layer. The use of a thin-film device minimizes generation volume and maximizes hardness in the transient gamma environment. The PIN diode used for sensing transient gamma radiation is built into the substrate.

DETAILED DESCRIPTION OF THE INVENTION

Figure 1:
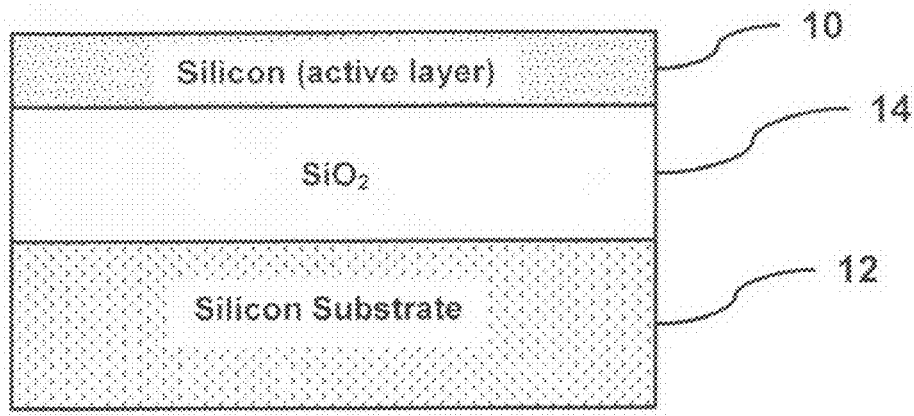
FIG. 1 diagrammatically illustrates the cross-section of a semiconductor structure, wherein a thin silicon layer is separated from an underlying substrate by an intervening layer of silicon dioxide.

The basic SOI material employed to produce the improved NED in accordance with the present invention is shown in FIG. 1 as comprising a thin active silicon layer 10 separated from an underlying semiconductor (silicon) support substrate 12 by a layer of silicon dioxide 14 therebetween. This basic SOI material may be produced by any of the well known methods for producing such material, such as, for example, the process well known as "Separation by IMplantation of OXygen" (SIMOX); the process well known as "bonded wafer" processing; or any of the other well known process for producing SOI material. The method of producing the basic SOI material is not a limitation of the present invention. All of the individual microelectronic devices that are used in the signal processing circuitry of the NED are created in the active layer of silicon 10 as shown in the accompanying Figures, using techniques that are well known in the art. Said signal processing circuitry is well known in the electrical arts for processing the signal current generated in the PIN diode in the presence of radiation, and may be comprised of circuit elements such as amplifiers, transistors, resistive elements, filters, capacitive elements, and other circuit elements. The techniques for fabricating said signal processing circuit elements within the active silicon layer, and the circuit topologies utilized in said signal processing circuits, are well known in the art.

The PIN diode is integrated into the silicon support substrate 12 as described herein.

While the structure disclosed herein discusses a monolithic nuclear event detector in which the PIN diode of the invention and signal processing circuitry are integrated in to one semiconductor chip, the PIN diode of the present invention may be fabricated "stand alone" according to the method of the invention using the SOI process.

In general, the substrate used in SOI processes is electronically inactive and not electronically connected. However, the substrate may be connected to supply voltage to de-bias the bottom of the active Si layer. Depending on wafer size and final wafer thickness, the SOI substrate may be on the order of, for example, 200-400 microns thick. This is a suitable thickness for a PIN diode. As an example, an article by Marczewski, J. et al, entitled "SOI Active Pixel Detectors of Ionizing Radiation-Technology and Design Development", IEEE Trans. Nuc. Sci., vol. 51, no. 3, pp 1025-1028 (June 2004), describes a 300 um thick detector of float zone (FZ) silicon material, with a resistivity of up to 4000 ohm-cm. The detector is used for particle detection in high-energy physics applications. Clearly, a similar high-resistivity material can be used as an SOI substrate. Given that the substrate is p-type (as in Honeywell's 0.8 micron SOI process) all that remains is to create the diode structure, consisting of the PIN structure, a suitable p+ contact region to the high resistivity p-type substrate material, and an n+ contact that also forms the n-side of the PIN diode.

The process employed to form the NED in accordance with the present invention may be understood with the reference to FIGS. 1 through 11. Here, both the n+ and the p+ contact regions are on the top surface of the wafer. This is an excellent fit with current manufacturing methods, as opposed to backside processing operations which have been shown to be detrimental to product yield. Using, for example, a process such as the Metal Topside Contact process option in the Honeywell 0.8 micron SOI process will allow the fabrication of a substrate PIN detector in the substrate without any process modifications. The use of a metal topside contact etch combines a standard reverse field etch, a topside contact etch, and a standard contact etch to allow the first metal to make contact through the buried oxide directly to the silicon substrate.

Referring now to FIG. 1, an SOI starting material comprising a p-type substrate 12 having a resistive property, a top surface, and a bottom surface, a buried oxide ("BOX") layer 14 having a top surface and a bottom surface in which said bottom surface of said BOX layer 14 is in contact with said top surface of said p-type substrate 12, and an active silicon layer 10 having a top surface and a bottom surface in which said bottom layer of said active silicon layer 10 is in contact with said top surface of said BOX layer 14 is obtained.

Figure 2:
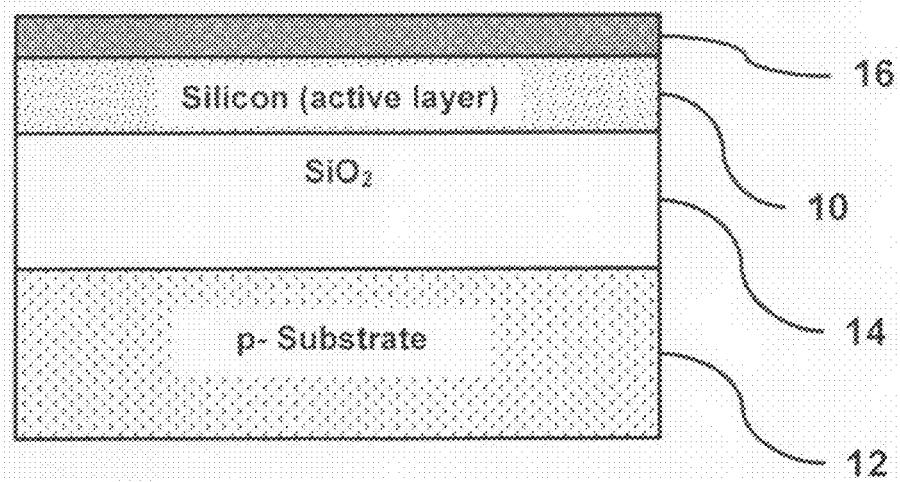
FIG. 2 is a diagrammatic cross-sectional view of an NED integrated circuit structure in the course of its manufacture according to the present invention in which a layer of silicon dioxide has been deposited on the top layer of active silicon.

Referring now to FIG. 2, a layer of silicon dioxide 16 having a top surface and a bottom surface is grown onto said top surface of said active silicon layer 10 by a first oxidation step such that said bottom surface of silicon dioxide layer 16 is in contact with said top surface of said active silicon layer 10.

Figure 3:
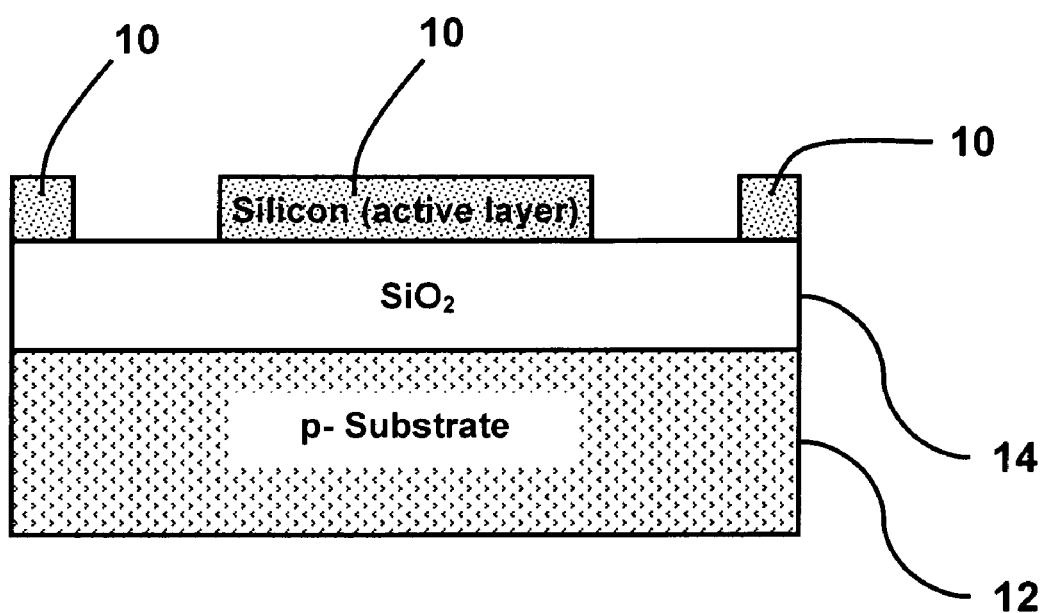
FIG. 3 is a diagrammatic cross-sectional view of an NED integrated circuit structure in the course of its manufacture according to the present invention in which photoresist has been applied, etching of the silicon dioxide layer has been performed, followed by selective etch of the active silicon layer.
Figure 11:
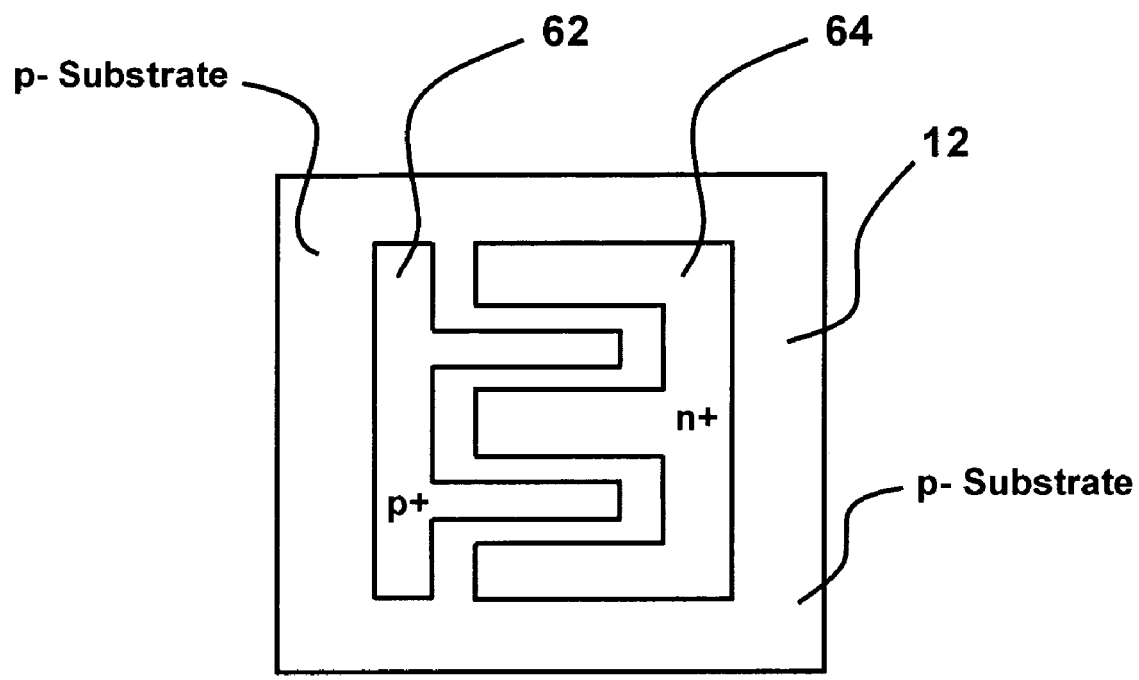
FIG. 11 is a plan view of an exemplary desired pattern, termed an interdigitated pattern, of the p+ and the n+ doping regions formed in the p-substrate of the PIN diode structure of the present invention.
Figure 12:
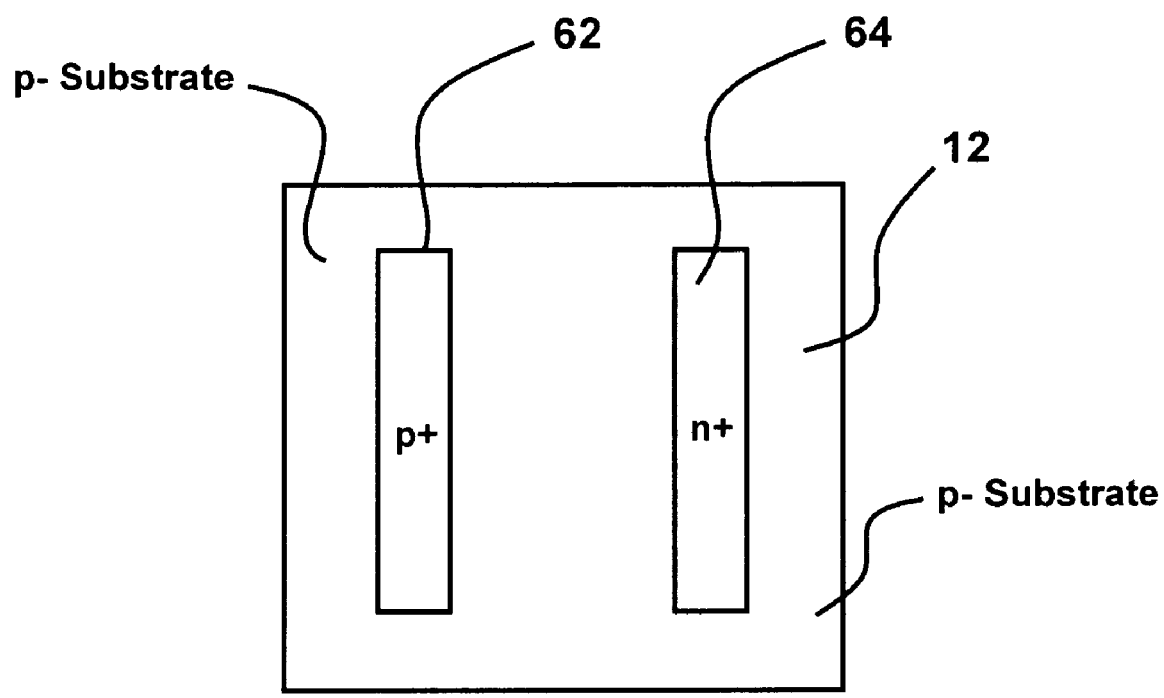
FIG. 12 is a plan view of an alternative exemplary desired pattern, termed a linear pattern, of the p+ and the n+ doping regions formed in the p-substrate of the PIN diode structure of the present invention.

A first lithography step, comprising applying photoresist then etching, occurs after the first oxidation step. A first application of photoresist is performed in which photoresist is deposited upon said top surface of said active silicon layer resulting in a first photoresist layer, and said first photoresist layer is then patterned in a desired pattern using techniques well known in the art to define anode and cathode regions of the substrate PIN diode. Said desired pattern may be shaped in any pattern that fits upon said top surface of said SOI starting material, such as, for example, serpentine, linear, or interdigitated patterns, but is preferably interdigitated as shown in FIG. 11. An example of a linear desired pattern is shown in FIG. 12. Following the first application of photoresist, two selective etches are performed. A first etch is selective of the oxide layer 16; a second etch is a selective etch of the silicon active layer 10. Following said second etch step, said first photoresist layer is then stripped using techniques well known in the art. The resulting structure is shown in FIG. 3.

Figure 4:
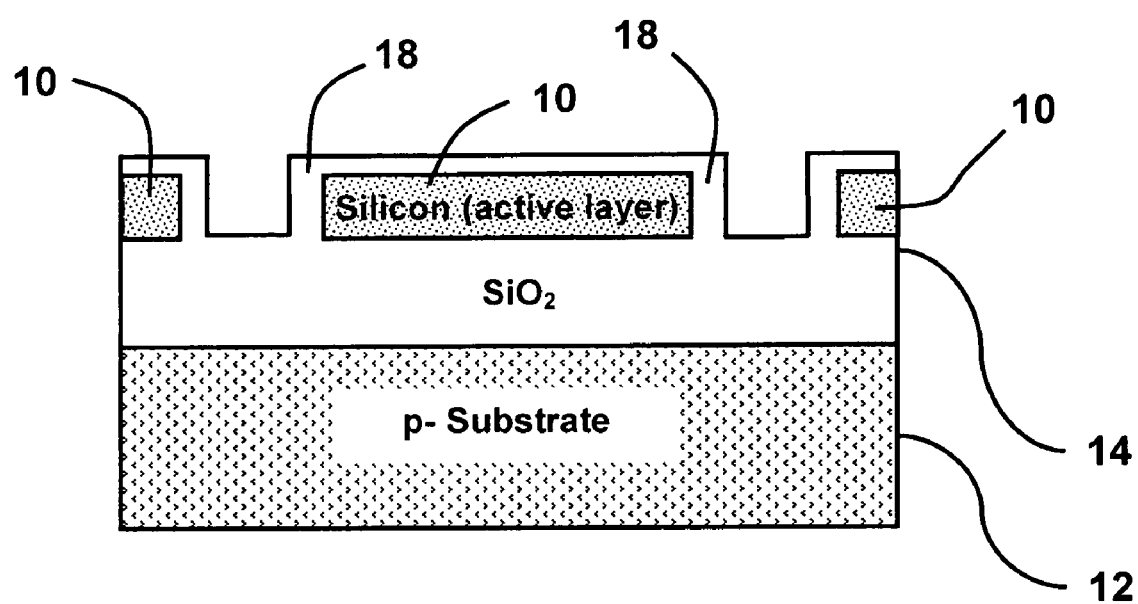
FIG. 4 is a diagrammatic cross-sectional view of an NED integrated circuit structure in the course of its manufacture according to the present invention in which additional silicon dioxide has been applied.

A second oxidation step is next performed to electrically isolate said silicon active layer 10 by means of a grown oxide layer 18, resulting in the structure shown in FIG. 4.

Figure 5:
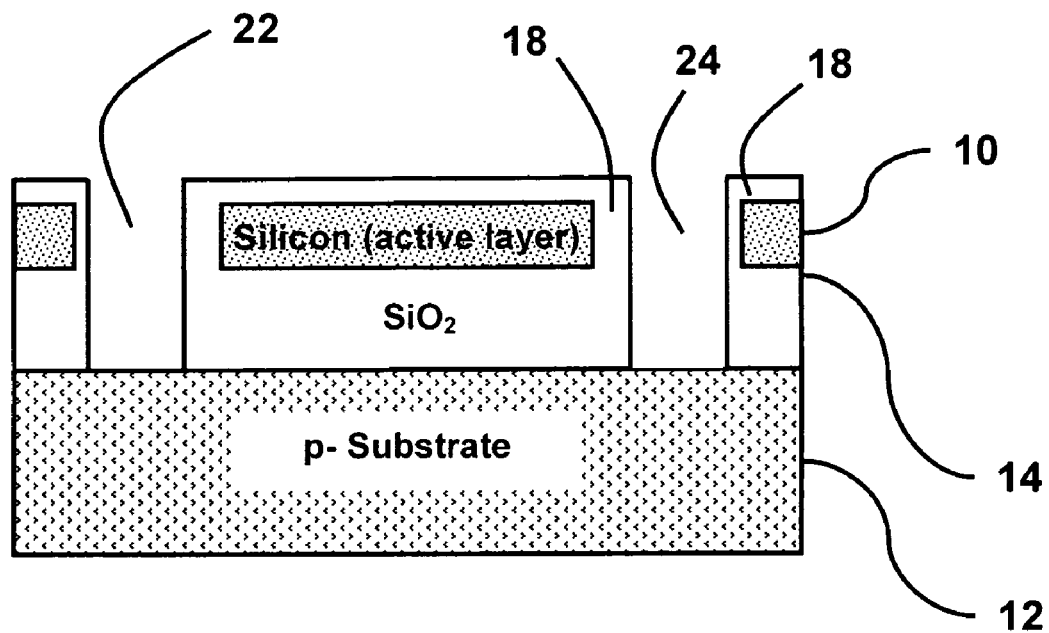
FIG. 5 is a diagrammatic cross-sectional view of an NED integrated circuit structure in the course of its manufacture according to the present invention showing apertures etched into the silicon dioxide for use in forming p+, n+, and metalized contacts for the diode.

To define the actual contact regions, a second lithography step is now performed. A second application of photoresist performed in which photoresist is deposited onto the top surface of said structure forming a second photoresist layer and said second photoresist layer is patterned to define locations of the anode and cathode of the substrate implanted PIN diode, utilizing said desired pattern as utilized in the first lithography step. This is followed by a third etch step, this time of the oxide layer 14, to open a first implant aperture 22 for subsequent p+ anode implant and a second implant aperture 24 for subsequent n+ cathode region implant. Said second photoresist layer is then stripped. The resulting structure is shown in FIG. 5.

Figure 6:
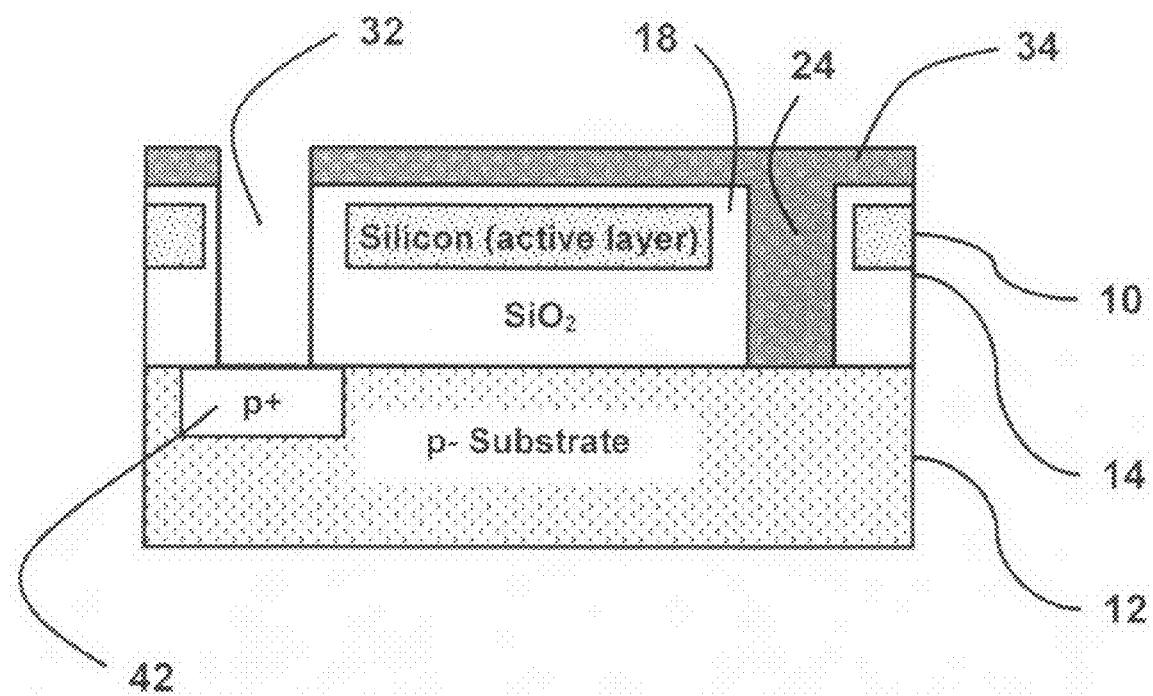
FIG. 6 is a diagrammatic cross-sectional view of an NED integrated circuit structure in the course of its manufacture according to the present invention in which photoresist has been deposited, etched, and the p+ region has been formed.

Referring now to FIG. 6, the p+ anode is next created. To create the p+ anode contact to the PIN diode, a third lithography step is performed in which a third application of photoresist is performed in which photoresist is deposited on the upper surface of the structure, creating a third photoresist layer 34 as shown in FIG. 6. Said third photoresist layer 34 is patterned as shown in FIG. 6 leaving the anode aperture 22 exposed. A fourth etch step is then performed to open an anode implant aperture 32 in photoresist layer 34 for the p+ implant, resulting in the structure shown in FIG. 6. A p+ implant is then performed through the aperture 32 using techniques well known in the art, thus creating a p+ anode region 42 in a first portion of the top surface of the p-substrate 12 as shown in FIG. 6.

Figure 7:
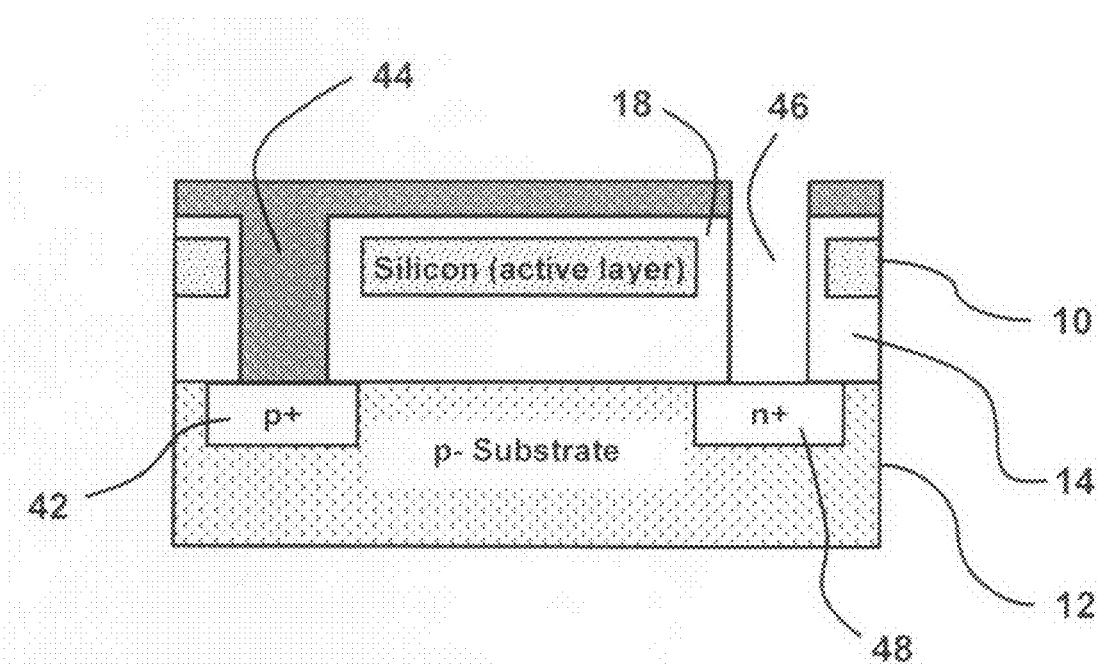
FIG. 7 is a diagrammatic cross-sectional view of an NED integrated circuit structure in the course of its manufacture according to the present invention in which photoresist has been deposited, etched, and the n+ region has been formed.
Figure 8:
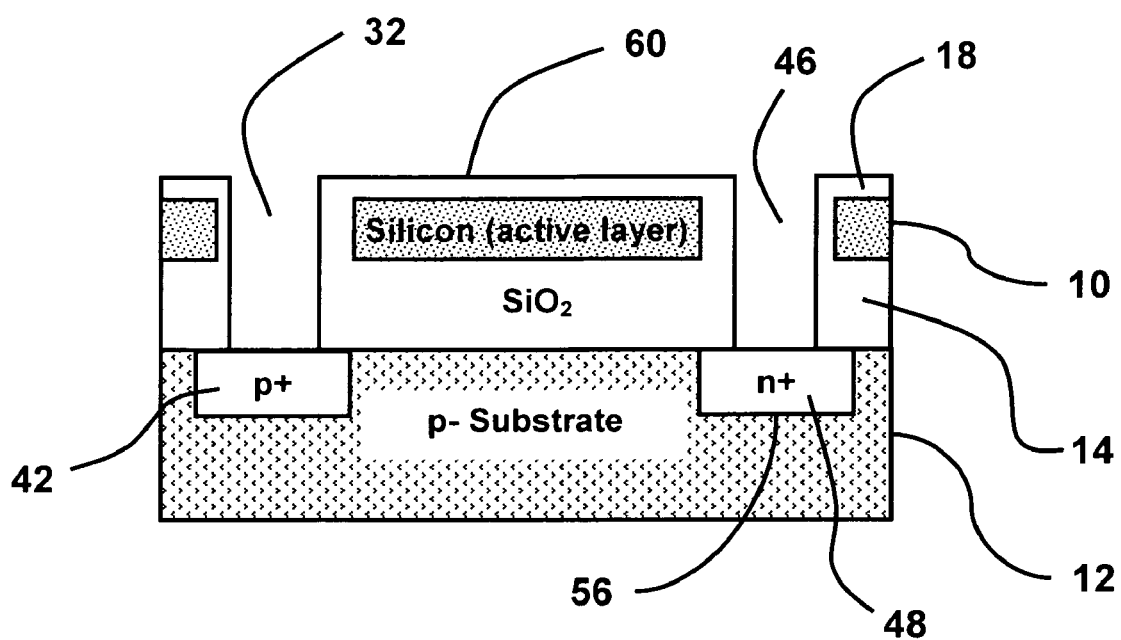
FIG. 8 is a diagrammatic cross-sectional view of an NED integrated circuit structure in the course of its manufacture according to the present invention in which the photoresist material has been stripped from the structure.

Following said p+ region implant, said third photoresist layer 34 is stripped using techniques well known in the art, and a fourth application of photoresist is performed in which photoresist is deposited on the upper surface of the structure, creating fourth photoresist layer 44. Said fourth photoresist layer 44 is then patterned as shown in FIG. 7 leaving said cathode aperture exposed to define a cathode aperture 46 for implanting an n+ cathode. An n+ implant is then preformed through said aperture 46 using techniques well known in the art, realizing an n+ cathode region 48 in a second portion of the top surface of the p-substrate 12. Said fourth photoresist layer 44 is next stripped, again using techniques well known in the art, resulting in the structure shown in FIG. 8. Said resulting structure shown in FIG. 8 has an upper surface 60, an anode aperture 32, and cathode aperture 46.

The remainder of the method deals with metallization and passivation. A metal layer 75 having a top surface and a bottom surface is non-selectively deposited onto said upper surface 60 and into said anode aperture 32 and cathode aperture 46. A fifth application of photoresist is performed in which photoresist layer 70 is deposited onto said top surface of metal layer 75 forming a fifth photoresist layer. Said fifth photoresist layer is then patterned to define metallic contacts to the anode and cathode regions as shown in cross section in FIG. 9. The metal not covered by the said fifth photoresist layer is unwanted metal: said unwanted metal is then etched in a fifth etch step, leaving a first metallic anode contact 66 which is in electrical communication with anode region 62, and a second metallic cathode contact 68 which is in electrical communication with cathode region 64, as shown in FIG. 10. Said fifth photoresist layer 70 is then stripped using techniques well known in the art.

As a final optional step, the resulting integrated PIN diode and signal processing chip may be passivated as is currently done as standard practice in the semiconductor integrated circuit art.

Figure 9:
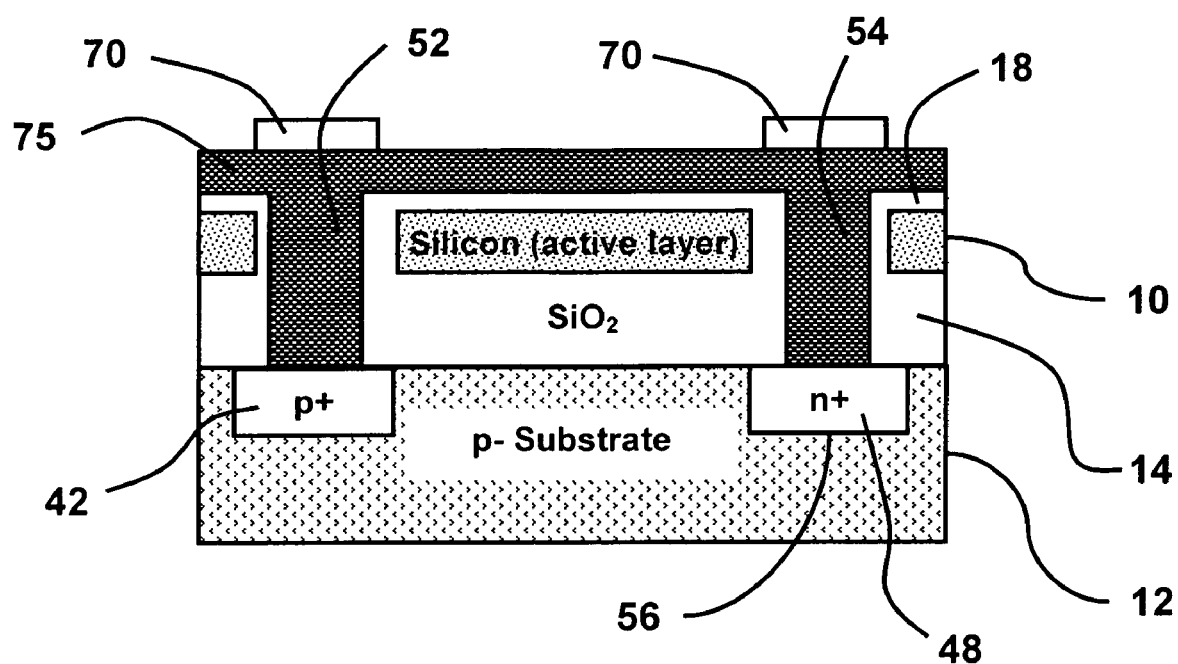
FIG. 9 is a diagrammatic cross-sectional view of an NED integrated circuit structure in the course of its manufacture according to the present invention in which has undergone metallization in order to form metallic contacts to the PIN diode.
Figure 10:
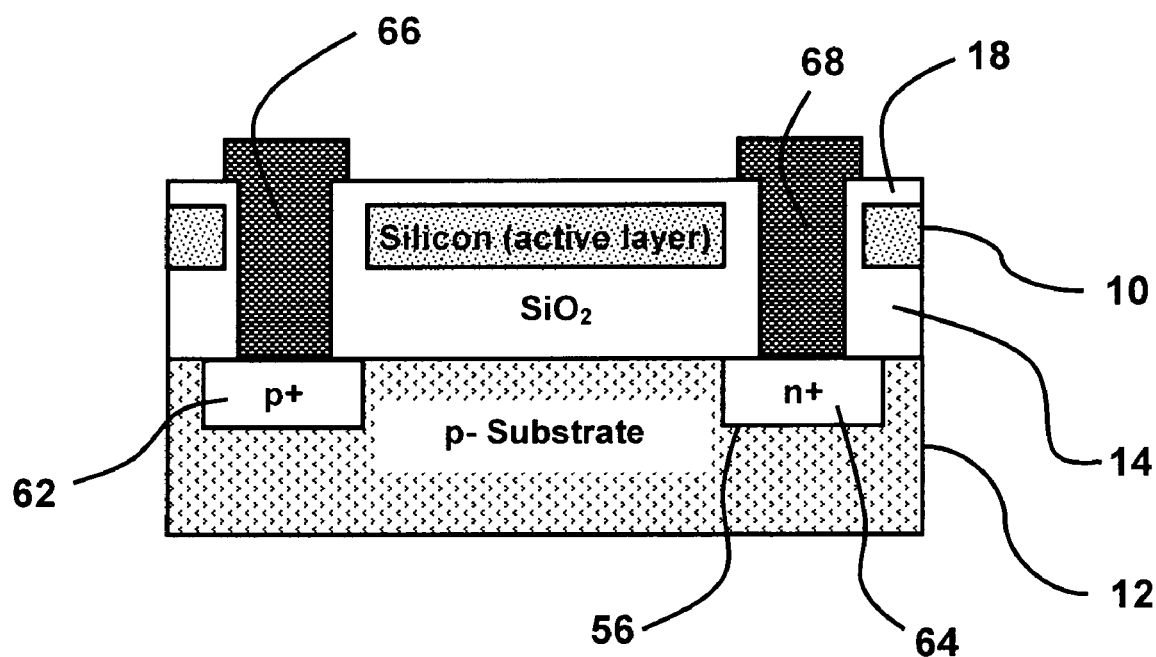
FIG. 10 is a diagrammatic cross-sectional view of an NED integrated PIN diode circuit structure according to the present invention.

The resulting substrate diode is a lateral device, and the depletion layer will spread horizontally from the p/n+ junction 56 through the p-substrate 12 as shown in FIGS. 9 and 10. To create the substrate diode, no process modifications to any standard SOI process are necessary. It will be understood that the dimensions of said desired pattern used to create said PIN diode as described herein are a function primarily of said resistive property of said silicon substrate 12, and it is well within the understanding of a person of average skill in the art to determine the dimensions of said desired pattern without undue experimentation.

Referring now to FIG. 11, source region 62 and drain region 64 are then formed by a silicon dioxide etch and source implant and drain implant.

Referring to FIG. 10, the p+ and n+, regions 62 and 64 and the p-substrate 12, respectively, make up the substrate PIN diode structure. To create increased carrier generation volume, the source and drain regions 62 and 64 may have an interdigitated topology, as shown in the plan view of FIG. 11.

If a high resistivity substrate silicon material is available the same techniques used to create the structure shown in FIG. 10 may be used. However, the resulting PIN diode would produce higher currents, due to a greater collection volume, as a result of the high resistivity substrate material.

Where bonded wafer fabrication technology is employed, the starting material of the handle wafer may be processed prior to being oxidized and bonded. This allows more elaborate doping profiles in the substrate material, eliminating the need for serpentine topology shown in FIG. 11 and thus reducing required chip size.

While a specific embodiment of the semiconductor structure and method of fabrication are disclosed herein, it will be understood that there exist equivalent embodiments of the structure, and equivalent steps of the method, and that such equivalents are within the intended scope of the present invention.

What is claimed is:

1. A method of manufacturing a PIN diode in a Silicon On Insulator (SOI) substrate, comprising the steps of:
   obtaining a semiconductor structure comprising a $p^-$ type substrate having a top and bottom surface, a buried oxide layer having a top and bottom surface, and an active silicon layer having a top and bottom surface, in which said top surface of said $p^-$ type substrate is in contact with said bottom surface of said buried oxide layer and said top surface of said buried oxide layer is in contact with said bottom surface of said active silicon layer;
   depositing a first photoresist layer upon said top surface of said active silicon layer in a desired pattern;
   etching said active silicon layer to form a first aperture for an anode region and a second aperture for a cathode region;
   stripping said first photoresist layer;
   applying a first applied layer of silicon dioxide to an upper surface of the resulting structure having a top surface and a bottom surface;
   applying a second photoresist layer upon said top surface of said first applied layer of silicon dioxide in said desired pattern;
   etching said first applied silicon dioxide layer to expose said top surface of said $p^-$ type substrate in said anode region and said cathode region;
   stripping said second photoresist layer;
   applying a third photoresist layer upon an upper surface of the resulting structure;
   implanting a p+ region in said exposed top surface of said p− type substrate in said anode region;
   stripping said third photoresist layer;
   applying a fourth photoresist layer upon said upper surface of the resulting structure;
   implanting an n+ region in said exposed top surface of said $p^-$ type substrate in said cathode region;
   stripping said fourth photoresist layer;
   depositing a metal layer upon an upper surface of the resulting structure; and
   applying a fifth photoresist layer upon said upper surface of the resulting structure;
   etching unwanted metal from said metal layer in a desired pattern to form a first metallic anode contact in electrical communication with said anode region thereby creating a PIN diode anode contact, and to form a second metallic cathode contact in electrical communication with said cathode region, thereby creating a PIN diode cathode contact; and
   stripping said fifth photoresist layer.

2. The method of claim 1 in which said desired pattern is an interdigitated pattern.

3. The method of claim 2 further comprising the step of passivating.

4. The method of claim 2 further comprising the step of creating signal processing circuitry in said active silicon layer, said signal processing circuitry being in electrical communication with said PIN diode anode contact and said PIN diode cathode contact.

5. The method of claim 1 in which said desired pattern is a linear pattern.

6. The method of claim 5 further comprising the step of passivating.

7. The method of claim 5 further comprising the step of creating signal processing circuitry in said active silicon layer, said signal processing circuitry being in electrical communication with said PIN diode anode contact and said PIN diode cathode contact.

8. The method of claim 1 further comprising the step of passivating.

9. The method of claim 8 further comprising the step of creating signal processing circuitry in said active silicon layer, said signal processing circuitry being in electrical communication with said PIN diode anode contact and said PIN diode cathode contact.

10. The method of claim 1 further comprising the step of creating signal processing circuitry in said active silicon layer, said signal processing circuitry being in electrical communication with said PIN diode anode contact and said PIN diode cathode contact.

* * * * *